(12) United States Patent
Kramer et al.

(10) Patent No.: US 6,793,007 B1
(45) Date of Patent: Sep. 21, 2004

(54) HIGH FLUX HEAT REMOVAL SYSTEM USING LIQUID ICE

(76) Inventors: Gary W. Kramer, 13735 Moss Rock, Auburn, CA (US) 95602; Richard S. Frankel, 230 Josselyn La., Woodside, CA (US) 94062

( * ) Notice: Subject to any disclaimer, the term of this patent is extended or adjusted under 35 U.S.C. 154(b) by 0 days.

(21) Appl. No.: 10/460,351

(22) Filed: Jun. 12, 2003

(51) Int. Cl.[7] .............................. F28F 7/00; F28D 15/00
(52) U.S. Cl. ............................... 165/80.4; 165/104.33; 165/908
(58) Field of Search ......................... 165/80.4, 62, 63, 165/80.2, 104.32, 104.21, 104.33, 104.17, 908; 361/699, 700, 701; 257/716; 62/74

(56) References Cited

U.S. PATENT DOCUMENTS

| | | | | |
|---|---|---|---|---|
| 4,596,120 A | * | 6/1986 | Knodel et al. ................. 62/59 |
| 4,932,168 A | * | 6/1990 | Tada et al. ..................... 451/39 |
| 5,263,536 A | * | 11/1993 | Hulburd et al. ............. 165/80.4 |
| 5,270,572 A | * | 12/1993 | Nakajima et al. ........... 257/714 |
| 5,931,003 A | * | 8/1999 | Newman et al. ............... 62/74 |
| 6,498,725 B2 | * | 12/2002 | Cole et al. ................... 361/700 |
| 6,543,246 B2 | * | 4/2003 | Wayburn et al. ........... 62/259.2 |
| 6,650,542 B1 | * | 11/2003 | Chrysler et al. ............ 361/699 |

* cited by examiner

Primary Examiner—Tho V Duong
(74) Attorney, Agent, or Firm—Russo & Hale LLP; William C. Milks, III

(57) ABSTRACT

A cooling system for apparatus powered by electricity, that generates a substantial amount of heat during operation, and the heat must be dissipated to avoid failure of electrical and/or electronic components, such as semiconductor devices and integrated circuits, comprising the electrical apparatus. The cooling system employs liquid ice impinged on a heat sink thermally coupled with electrical apparatus. The attendant phase changes of the liquid ice first to water and then to steam remove a substantial amount of waste heat to prevent failure of the electrical apparatus.

18 Claims, 1 Drawing Sheet

HIGH FLUX HEAT REMOVAL SYSTEM USING LIQUID ICE

BACKGROUND OF THE INVENTION

1. Field of the Invention

The present invention relates to cooling systems and, more particularly, to cooling systems for electrical apparatus. Generally, the present invention provides a cooling system for apparatus powered by electricity, that generates a substantial amount of heat during operation, and the heat must be dissipated to avoid failure of electrical and/or electronic components, such as semiconductor devices and integrated circuits, comprising the electrical apparatus. Specifically, one embodiment of the present invention provides a cooling system preferably employing liquid ice jet impinged on a heat sink thermally coupled to electrical apparatus, and the attendant phase changes of the liquid ice first to water and then to steam to remove a substantial amount of waste heat to prevent failure of the electrical apparatus.

2. Description of the Prior Art

Cooling is an important process associated with operation of high-density electronic devices. Existing waste heat removal technology is limited to approximately 100 W/cm$^2$.

In the next ten years, the power density of high-power electronics is expected to increase and generate waste heat that will exceed 1,000 W/cm$^2$. Thermal management technology capable of removing waste heat of 1,000 W/cm$^2$ produced by advanced power electronic devices is needed.

For example, the U.S. Department of Navy has reported that the cooling requirements are expected to increase at least an order of magnitude during the next decade. As stated in "Next Generation Navy Thermal Management Program," CARDIVNSWC-TR-82-2002/12, by Michael Kuszewski and Mark Zerby, Naval Surface Warfare Center:

"It is expected that heat fluxes for new technologies such as Advanced Radar will exceed 1000 W/cm$^2$, and some advanced weapons may be higher. These heat fluxes are expected to be present by the end of this decade. Heat fluxes are growing so fast in the electronics arena that even Intel, who has been designing its Thermal Management Systems to handle less than 100 W/cm$^2$, has extrapolated its increase of heat flux to reach 1000 W/cm$^2$ before the end of this decade."

Accordingly, the U.S. Navy recently published RFQ N03-T022 Acquisition Program: DD(X); CVN(X) having the:

"OBJECTIVE: To develop advanced thermal management technologies to improve high flux waste heat removal by a factor of 10X over existing technologies in electronic devices."

Also,

"The proposed solution must be able to keep the semiconductor junction below 125F [sic, 125C]. . . ."

Considered in more detail, spray cooling with water is a known cooling technique to remove heat from electronics relatively efficiently. See, Kuszewski and Zerby, supra. In situations where cooling very hot surfaces or protecting sensitive surfaces from overheating is important, then the most effective technique available is direct impact by impingement jets (not necessarily sprays). The reverse side of a mounting plate, on which the electronic devices are disposed, is sprayed by high velocity impinging jets of water. The heat generated by the electronics is removed at constant temperature by the liquid vapor phase of the water.

The heat transfer processes involved in water sprays impinging on hot surfaces have been studied by, among others, Bemardin J D, and Mudawar I, "Film boiling heat transfer of droplet streams and sprays," *Intl. J. Heat Mass Transfer*, 40 (11), 2579–2593 (1997). Rockwell has also published a paper that reports having achieved removal of 1,000 W/cm$^2$ using a water jet plus boiling. However, Rockwell was only able to cool a very small area (unspecified).

The challenge presented by the need to conduct waste heat from electronic devices efficiently and to provide removal of waste heat on the order of 1,000 W/cm$^2$ at a rate that will maintain the operating temperature of electronic devices at or below 125° C. is imposing. The 125° C. limit requires efficient heat transfer to sink heat away from the electronic apparatus. The high heat flux (1,000 W/cm$^2$) further requires an effective heat removal process to maintain the operating temperature of electronic devices at or below the 125° C. limit.

It would therefore be desirable to provide removal of waste heat from electronic devices to maintain the operating temperature of electronic devices at or below 125° C. It would also be desirable to remove waste heat at a rate to prevent the operating temperature of electronic devices from exceeding the 125° C. limit. Furthermore, it would be desirable to achieve these objectives for electrical apparatus that generates waste heat on the order of 1,000 W/cm$^2$.

SUMMARY OF THE INVENTION

One embodiment of the present invention provides a cooling system for thermally conducting and removing high heat flux waste heat. The cooling system in accordance with one embodiment of the present invention employs a refrigerant or coolant, preferably, liquid ice, and, preferably, at reduced pressure to improve high heat flux waste heat removal by a factor of ten times over known cooling techniques. One embodiment of the cooling system in accordance with the present invention is especially suitable to the challenge of removing high heat flux waste heat resulting from operation of power electronics given the severe limitation on the maximum operating temperature allowable for electronic devices.

One preferred embodiment of the cooling system in accordance with the present invention provides a heat transfer plate consisting of copper, aluminum, silver, or another suitable thermally conductive material, such as beryllium oxide ceramic, boron nitride, aluminum nitride ceramic, or diamond, with high tensile strength to enable efficient heat transfer by thermal conduction, in thermal contact with the electrical apparatus. The heat transfer plate also serves as a structural component of a circulation subsystem that contains the refrigerant or coolant. Impinging jets deliver copious amounts of a refrigerant or coolant to the hot surface of the heat transfer plate opposite the side on which the electronic apparatus is disposed in thermal contact with the heat transfer plate. In a preferred embodiment of the present invention, jet impingement of a refrigerant or coolant in the form of liquid ice is employed.

Jet impingement of liquid ice is provided on the heat transfer plate at atmospheric pressure or at a reduced pressure. Preferably, the liquid ice may be maintained at less than atmospheric pressure, for example, in a partial vacuum, wherein the temperatures associated with phase changes of melting and boiling are lowered.

With the operating temperature of electronic devices required to be at 125° C. or below, and the temperature of the liquid ice at approximately −2° C., there is a large temperature differential and two phase changes as the liquid ice first transforms to water and then to steam to effect heat removal and cooling as the steam is circulated via the circulation subsystem away from the heat transfer plate. In addition, the super-cooled liquid consisting of liquid ice maintains steam bubbles associated with melted liquid ice boiling small, resulting in more effective heat transfer. Finally, use of liquid ice as a refrigerant or coolant is compatible with cooling systems aboard ships operated by the U.S. Navy, thereby satisfying the apparent desirability and advantage to integrate the cooling system in accordance with the embodiments of the present invention with other cooling systems on a ship (for example, air conditioning systems).

The foregoing and other objects, features, and advantages of the present invention will become more readily apparent from the following detailed description of various embodiments, which:proceeds with reference to the accompanying drawing.

BRIEF DESCRIPTION OF THE DRAWING

The various embodiments of the present invention will be described in conjunction with the accompanying figure of the drawing to facilitate an understanding of the present invention. In the drawing.

DETAILED DESCRIPTION OF THE PREFERRED EMBODIMENTS

Figure 1:
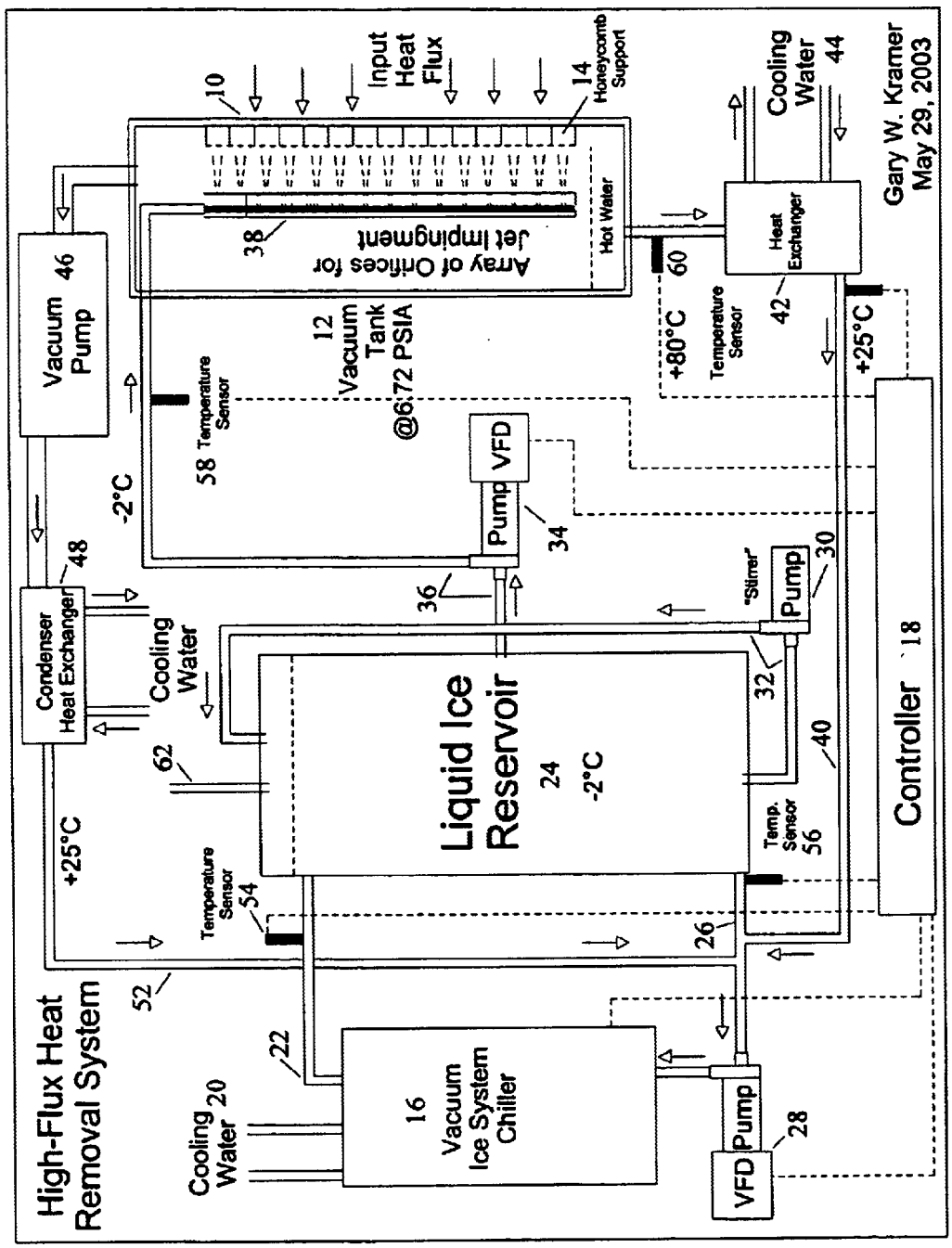
FIG. 1 is a block diagram of one embodiment of the cooling system in accordance with the present invention employing liquid ice as a refrigerant or coolant.

The principle underlying the cooling system in accordance with one embodiment of the present invention is the substantial amount of heat that is required to transition ice to water and then water to steam. The cooling system of the present invention therefore pertains to two distinct operating regimes in cooling, namely, the heat of fusion incident to the phase change of ice to water at 0° C. and the heat of evaporation incident to the subsequent phase change of water to steam at 100° C. These phase changes occur very rapidly when liquid ice is employed as a refrigerant or coolant exposed to waste heat on the order of 1,000 W/cm².

Considered in more detail, at 0° C., the temperature of ice ceases to rise, even though heat continues to be applied and absorbed. The reason for this phenomenon is added heat is used to break crystal bonds in the ice. Melting one gram of ice requires 80 calories/gram.

Only when all of the ice melts does the temperature of the resulting water begin to rise. Then, each calorie absorbed by the water increases the water temperature by 1° C. until the boiling temperature, 100° C, is reached. At this point, the 100° C. temperature remains constant as heat is applied until the boiling water is vaporized to steam.

One gram of liquid water at 100° C. must absorb 540 calories of thermal energy in order to vaporize, forming steam. The 540 calories required to vaporize a gram of water at 100° C. is a relatively large amount of energy, much more than the amount required to bring a gram of ice at absolute zero (−273° C.) to boiling water at 100° C.

It should also be noted that evaporation occurs beneath the surface of liquid water in the boiling process. Bubbles of vapor typically form in the water and are buoyed to the surface, where they escape. Bubbles form at the boiling temperature, when the pressure of the vapor within them is great enough to resist the pressure exerted by the surrounding liquid phase water, which is determined in part by the atmospheric pressure. Lowering the pressure lowers the boiling temperature.

The embodiments in accordance with the present invention provide a cooling system implementing a novel thermal management method to remove waste heat from electrical apparatus and/or electronic devices, such as power semiconductors, with heat flux densities on the order of 1,000 W/cm². The embodiments of the present invention also maintain the semiconductor, junctions at 125° C. or below with no waste heat added into the workspace.

The cooling system for removing waste heat from electronic devices using the refrigerant or coolant will be described below. The refrigerant or coolant employed in accordance with the embodiments of the present invention is generally referred to as "liquid ice." The term "liquid ice" means liquid ice, slurry ice, pumpable ice, slush ice, binary ice, and equivalent material. Liquid ice typically consists of a suspension of relatively small (100–700 microns effective diameter) ice crystals in a mixture of water and freezing point depressant. Preferably, the ice in the water comprises crystals no greater than 200 microns effective diameter, although it is conceivable that many crystals of the ice may form clusters, the aggregate size of which is greater. Liquid ice, at concentrations in the range of 5–30% water by weight, has flow properties approximating those of water, i.e., the liquid ice can be handled, unlike normal ice, by standard equipment, such as pumps, pipes, and nozzles. Unlike slowly melting normal ice, liquid ice undergoes near instantaneous phase change because of the vast surface area to volume ratio of the microscopic liquid ice crystals.

Typical freezing point depressants include salts (for example, NaCl), ethanol, methanol, propylene glycol, or ethylene glycol. Other contemplated freezing point depressants include sodium bicarbonate, sugar, acetic acid, citric acid, and Talin. A mixture of any of the freezing point depressants can also be used. In the case of a ship, the seawater, which already contains salt, can be pumped through an icemaker to create ice crystals within the seawater. The substance used as the freezing point depressant and the concentration in water largely determine the characteristics of the resulting liquid ice.

See, ASHRAE Research Project 1166, "Behavior of ice slurry in thermal storage systems," 2002.

The substance used as a freezing point depressant and its concentration in water largely determines the particular nature of the resulting liquid ice. In general, $X_{ice}=1-X_0/X_{cf}$ where $X_{ice}$ is the equilibrium ice concentration in suspension, $X_{cf}$ is the mass concentration of freezing point depressant in liquid phase, and $X_0$ is the overall initial concentration of depressant. Thus, a 20% solids concentration of ice in liquid ice made from brine can be produced at −6° C. using a starting solution with 8% by weight of salt.

Ice crystals in a liquid ice mixture are formed from pure water. As the number and size of ice crystals increase, the concentration of freezing point depressant in the remaining fluid increases until equilibrium is reached where no further ice formation at the operating temperature of the cooling system occurs. Since the ice generated consists of pure water only, the concentration of freezing point depressant in the remaining mixture rises and acts to "lubricate" the liquid ice, preventing localized melting and refreezing that would otherwise cause agglomeration. At concentrations of up to 540% water by weight, liquid ice is relatively easy to produce (at approximately −2° C.) and store and has flow properties approximating those of water, allowing the liquid ice to be handled by standard equipment, such as pumps, pipes, and nozzles.

Preferably, the percentage of ice to water by weight is above 20% and below 40%. However, any percentage of ice will be effective as long as the liquid ice is pumpable.

At a 20% concentration, liquid ice has approximately six times the cooling capacity of water at 6° C., and the latent heat needed to melt the ice content is about 70 kJ per kilogram of mixture. When used as a heat exchange fluid in contact with a solid surface, the volumetric flow rate of liquid ice having a 20% concentration of solids may be three to eight times lower than that of chilled water to obtain the same cooling effect. See, Bellas J, Chaer I, and Tassou S A, "Heat transfer and pressure drop of ice slurries in plate heat exchangers," *Proc. 6th UK Heat Transfer Conference*, I. Chem. E., Nottingham, England, 2001. At the highest concentrations compatible with pumpability (approximately 40%), pressure drops of three times those of chilled water have been reported. Very high energy transfer rates (above $3 kWm^{-2}K^{-1}$) are ensured by the vast quantities, omnipresence, and large surface area of the microscopic ice crystals, which undergo nearly instantaneous phase change at constant temperature on receipt of the enthalpy of the crystal.

The high flux heat removal cooling system in accordance with various embodiments of the present invention will now be described in conjunction with FIG. 1. The basic vapor-compression cycle provided by the cooling system shown in FIG. 1 is similar regardless of the concentration of the liquid ice mixture. In accordance with various embodiments of the present invention, liquid ice is the refrigerant or coolant, at atmospheric pressure or at a subatmospheric pressure.

The preferred embodiment in accordance with the present invention makes use of liquid ice at a subatmospheric pressure. The particular vapor-compression cycle of the cooling system shown in FIG. 1 is a high waste heat removal cycle employing active components including a chiller, evacuator, an array of spray nozzles, and condensers.

For applications requiring extremely high heat removal rates in a continuous duty cycle, the preferred embodiment of the active high flux heat removal cooling system in accordance with the present invention illustrates an application using liquid ice. In a preferred embodiment, the liquid ice is made from a mixture of water and ethanol, because ethanol reduces the boiling point as it depresses the freezing point of the binary solution. A reduced boiling point allows more flexibility in choosing the material used to shield the electrical apparatus from direct contact with the liquid ice. The cooling system preferably employs a 30% ice mixture concentration to provide more than 1,000 BTU/hr per pound of liquid ice flowing with an inlet temperature of −2° C. and a boiling point of +80° C. in a partial vacuum of 6.72 psia, as shown in FIG. 1. Liquid ice in bulk form or in a fluidized bed provides exceptionally high cooling rates at solid surfaces.

As shown in FIG. 1, the cooling system comprises a heat transfer plate 10 consisting of copper, aluminum, silver, or another suitable thermally conductive material, such as beryllium oxide ceramic, boron nitride, aluminum oxide ceramic, or diamond, with high tensile strength to enable efficient heat transfer by thermal conduction. The external electrical apparatus, for example, electronic devices, that generate the input heat flux indicated in FIG. 1, are disposed in heat transfer relationship with the heat transfer plate 10, for example, the electrical apparatus can be mounted in thermal contact with the heat transfer plate. Preferably, the heat transfer plate 10 is thin to maximize the thermal gradient and avoid heat stored in the heat transfer plate. Preferably, the thickness of the heat transfer plate 10 is on the order of approximately one to two millimeters and has a thickness that is the minimum thickness that enables the heat transfer plate to provide the structural portion of the circulation subsystem at the location at which the liquid ice removes high heat flux from the heat transfer plate.

In the preferred embodiment in accordance with the present invention in which the cooling system is operated at partial vacuum, the heat transfer plate 10 comprises all or a portion of a wall of a vacuum tank 12. The heat transfer plate 10 must have sufficient structural integrity to withstand external atmospheric pressure. Because the heat transfer plate 10 forms a portion of the cooling system, in order to have a heat transfer plate thin enough to provide effective heat transfer, the heat transfer plate can be internally reinforced, for example, by means of a honeycomb material 14, to prevent implosion under atmospheric pressure if the cooling system is operated at subatmospheric pressure. If the honeycomb material 14 is used for reinforcement, jets of liquid ice are preferably directed at the centers of the honeycomb openings to optimize heat transfer efficiency.

Honeycomb material 14 attached to the heat transfer plate 10, if designed with optimal jet spacing as the controlling factor, may help increase the heat transfer rate via the finning effect and by controlling the allocation of a portion of the hot surface to each jet flow. A series of parallel slots may also be beneficial, with some slots dedicated to vapor removal and sized appropriately.

As shown in FIG. 1, the cooling system further comprises a liquid ice generator 16. The liquid ice generator 16 can be a commercially available scraped surface ice slurry generator (for example, a Sunwell ice generator), an orbital rod system, or a vacuum ice system chiller. The latter type is shown in FIG. 1 and can provide up to 10,000 tons/day of liquid ice. The liquid ice generator 16 can be modulated from idle to full power either proportionally or by on/off cycling determined by a controller 18. A cooling water supply is connected to the liquid ice generator 16 to provide cooling for the internal compressor of the liquid ice generator (not shown).

The liquid ice generator 16 is connected by a pipe 22 to an inlet located proximate the top of a liquid ice reservoir 24. An outlet located proximate the bottom of the liquid ice reservoir 24 is connected through a pipe 26 to a first variable frequency drive (VFD) controlled liquid pump 28 that returns liquid ice to the liquid ice generator 16 to maintain the temperature of the liquid ice in the liquid ice reservoir at a predetermined temperature, for example, −2° C.

During conditions of light or low heat input loads, a stirring pump 30 maintains the liquid ice mixture uniformly isothermal. The stirring pump 30 recirculates the liquid ice mixture through a pipe 32 connected between an outlet proximate the bottom of the liquid ice reservoir 24 and an inlet proximate the top of the liquid ice reservoir.

A second VFD controlled liquid pump 34 delivers the liquid ice mixture through a pipe 36 from the liquid ice reservoir 24 to an array of orifices 38 that cause jet impingement of the liquid ice on the heat transfer plate 10. The heat transfer plate 10 is constructed of a suitable material with high heat conductivity. Materials such as copper or aluminum are preferred. If, however, an electrically insulating material is needed, then diamond, beryllium oxide ceramic, boron nitride, or aluminum nitride ceramic can be used. The material may be chosen by tensile strength to heat conductivity ratio. The thicker the heat transfer plate 10, the lower the temperature on the cooled side must be. For example, for copper having a 1.8 millimeter thickness, the temperature of the side that is cooled would need to be +80° C. in order to conduct 1,000 W/cm$^2$ through the heat transfer plate 10, if the temperature on the side heated by the electrical apparatus were to be maintained at 125° C. When using a higher boiling point, the thickness of the heat transfer plate 10 would be correspondingly reduced. Maximizing exposed surface area of the cooled side of the heat transfer plate 10 by judicious use of finning is preferred in order to increase surface area and increase cooling efficiency.

The array of orifices 38 can comprise relatively large aperture nozzles through which the liquid ice can be pumped. For example, the array of orifices 38 can comprise a matrix of pressure jet nozzles having a diameter of approximately 2 millimeters. For flat surfaces, a carefully arranged array of round nozzles can be more effective than a slot nozzle system for a given mass flow of liquid ice, but depending on the geometry of the surface to be cooled, slots can be superior.

The second VFD controlled liquid pump 34 can be controlled by the controller 18 to provide continuous or pulsating jet operation by the array of orifices 38. It should be noted that high-speed jets can cause cavitation and erosion of metals. (The leading edges of aircraft wings are damaged in this way when they fly through rainstorms.) This sets an upper limit on jet speed and has material property implications such that the choice of material for the heat transfer plate 10 and the design of the heat transfer plate are both important when using liquid ice.

After the liquid ice is impinged on the heat transfer plate 10, the spent liquid ice mixture that has not vaporized falls to the bottom of the vacuum tank 12 as a liquid. The first VFD controlled liquid pump 28 pumps the spent liquid through a pipe 40 that preferably connects to the pipe 26 so that the liquid is returned to the liquid ice generator 16. Preferably, a heat exchanger 42 is interconnected in the pipe 40, and the heat exchanger is connected to a cooling water supply 44. The heat exchanger 42 cools the liquid with cooling water to reduce the load of the liquid ice generator 16.

Additionally, at the top of the vacuum tank 12, a vacuum pump 46 preferably evacuates the vacuum tank 12 to a predetermined reduced pressure, for example, a partial vacuum of approximately 6.72 psia. A consequence of employing liquid ice as the refrigerant or coolant is that the compressor (not shown) of the vacuum pump 46 shown in FIG. 1 should not use oil as a lubricant. The water will wash the oil away. Dry lubricants or water/steam should be considered as alternative lubricants.

The steam resulting from boiling of the melted liquid ice is discharged by the vacuum pump 46 and is preferably condensed by a condenser heat exchanger 48 connected to a cooling water supply 50. From there, the condensate is pumped by the first VFD controlled liquid pump 28 through a pipe 52 that preferably connects to the pipe 26 so that the condensate is returned to the liquid ice generator 16.

The controller 18 controls the VFD controlled liquid pumps 28 and 34 to adjust the flow from the liquid ice generator 16 and the liquid ice reservoir 24 for varying thermal loads. Temperature sensors 54, 56, 58, and 60 provide feedback information to the controller 18 to allow the variable load adjustments. The temperature sensors 54, 56, 58, and 60 can be RTDs (Resistance Temperature Devices), thermocouples, or thermistors, for example.

Finally, an inlet 62 is provided at the top of the liquid ice reservoir 24 to initially charge the cooling system with water and freezing point depressant or to add water and/or freezing point depressant during operation. If the cooling system is installed on board a ship, seawater can be supplied through the inlet 62 for use in the production of liquid ice.

In operation, the active vapor-compression cycle cooling system shown in FIG. 1, employing low-pressure liquid ice as a refrigerant or coolant, provides an efficient high flux heat removal system. Heat is removed from the primary heat source, such as semiconductor modules, in thermal contact with the heat transfer plate 10 using liquid ice impinged on the heat transfer plate by the array of orifices 38. Since approximately 70% of the liquid ice is water, the impinging jet is believed to consist of droplets of water/freezing point depressant, larger particles of ice with most of the liquid stripped from them during jet impingement, and droplets of water containing the smallest ice particles. The ice particles and ice-containing droplets are most likely to reach the heat transfer plate 10 to provide improved cooling, while the liquid-only droplets will be the first to vaporize. The liquid ice is produced by the liquid ice generator 16, using water and a freezing point depressant, preferably ethanol, and stored in the liquid ice reservoir 24 from which the liquid ice is pumped by the second VFD controlled liquid pump 34 as and when required. The heat absorbed by the liquid ice, causing the liquid ice to undergo phase changes first to liquid and then to steam, is dissipated by the heat exchanger 42 and condenser 48, and residual liquid and condensate are recirculated to the liquid ice generator 16.

In accordance with another embodiment of the present invention, instead of the cooling system operating at partial vacuum, the cooling system can be operated at atmospheric pressure (1 bar). Operating at atmospheric pressure has advantages including obviating the need for the honeycomb material 14 and enabling the thickness of the heat transfer plate 10 to be decreased for improved thermal conduction. Inclusion of the vacuum pump 46 is preferred even if the cooling system is operated at atmospheric pressure. Unless the steam is drawn out of the vacuum tank 12, the pressure will rise and directly raise the liquid boiling temperature, reducing the cooling efficiency.

As shown in FIG. 1, the heat exchanger 42 is cooled by the cooling water supply 44, and the condenser 48 is cooled by the cooling water supply 50. In the application in which the cooling system is installed aboard ship and the cooling water supplies 44, 50 employ seawater, variable performance can result because of the non-constant temperature of seawater. Consequently, one contemplated modification to the embodiments of the present invention is to substitute a liquid ice cooling supply for one or both of the cooling water supplies 44, 50. The liquid ice can be fed from the liquid ice reservoir 24 or from an auxiliary liquid ice reservoir. Nevertheless, the final step in dissipating the heat would continue to use cooling water, for example, seawater, either directly in the condenser of the liquid ice generator 16, or through heat transfer panels built into the side of a ship, for example, assuming that sufficient surface area exists. Note that by using liquid ice as the primary cooling medium for the electrical apparatus and also for the condensation of the resulting steam and cooling of the liquid effluent, the cooling system can advantageously control thermal load shifting and storage for the cooling system.

The cooling system in accordance with the present invention enables improved cooling of electrical apparatus that generates substantial waste heat, for example, waste heat on the order of 1,000 W/cm$^2$. While various embodiments of the cooling system of the present invention and various contemplated modifications have been described above, other modifications and variations will likely occur to those persons skilled in the art. For example, rather than using continuous or pulsating jet impingement, the liquid ice can be atomized by passing it through a conventional pressure jet nozzle, in a manner similar to water mist systems. For example, an ice mist can be created by pumping liquid ice having a 20–25% concentration through a 500-micron nozzle at 70 bar. In addition to high-density heat removal, liquid ice is also a superior cooling fluid for both medium- and low-density heat exchange applications. As described above, for high-energy heat removal, the liquid ice is applied directly to a thermally conducting barrier. For medium energy devices, the liquid ice can be used to chill a secondary liquid in which the hot components of a conventional fluorochemical closed loop cooling system are immersed. For air-cooled low energy devices and general air conditioning, the liquid ice can be used for air chilling. Thus, the cooling system can integrate within the overall cooling services aboard a ship via a liquid ice generator and thermal energy storage tank. The foregoing description of the embodiments of the present invention is therefore exemplary and not limited to the specific embodiments that are disclosed above. The scope of the invention can only be ascertained with reference to the appended claims and the equivalents thereof.

What is claimed is:

1. A cooling system for thermally conducting and removing high heat flux waste heat from electrical apparatus, comprising:
   liquid ice at a predetermined pressure;
   a heat transfer plate having a first side thermally coupled with the electrical apparatus, the heat transfer plate being constructed from a thermally conductive material with high tensile strength to enable efficient heat transfer by thermal conduction;
   a circulation subsystem that contains the liquid ice, the heat transfer plate comprising a structural component of the circulation subsystem; and
   means for impinging the liquid ice on a second side of the heat transfer plate opposite the side on which the electrical apparatus is disposed.

2. The cooling system according to claim 1 wherein the liquid ice consists of a mixture of water and freezing point depressant comprising a member of the group consisting of salt, ethanol, methanol, propylene glycol, ethylene glycol, sodium bicarbonate, sugar, acetic acid, citric acid, and Talin.

3. The cooling system according to claim 2 wherein the liquid ice consists of a suspension of ice crystals having diameters in the range of approximately 100 to 700 microns.

4. The cooling system according to claim 2 wherein the percentage of ice to water by weight is in the range of approximately 20% to 40%.

5. The cooling system according to claim 1 wherein the heat transfer plate comprises a thermally conductive material selected from among the group consisting of copper, aluminum, silver, beryllium oxide ceramic, boron nitride, aluminum nitride ceramic, and diamond.

6. The cooling system according to claim 5 wherein the heat transfer plate has a thickness of approximately one millimeter to two millimeters.

7. The cooling system according to claim 1 wherein the means for impinging the liquid ice on the second side of the heat transfer plate comprises one or more nozzles that provide jet impingement of the liquid ice on the heat transfer plate.

8. The cooling system according to claim 1 wherein the predetermined pressure is atmospheric pressure.

9. The cooling system according to claim 1, further comprising a vacuum tank housing the means for impinging the liquid ice on the second side of the heat transfer plate and a vacuum pump connected to the vacuum tank for creating a vacuum in the vacuum tank, wherein the predetermined pressure is a partial vacuum, whereby the temperatures associated with phase changes of melting and boiling are lowered.

10. The cooling system according to claim 9, further comprising honeycomb material affixed to the heat transfer plate to reinforce the heat transfer plate.

11. The cooling system according to claim 9 wherein the partial vacuum is approximately 6 to 7 psia and the boiling point is approximately +80° C., the inlet temperature of the liquid ice is approximately −2° C., and the liquid ice concentration is approximately 30% ice to water by weight.

12. The cooling system according to claim 1, further comprising a liquid ice generator, a liquid ice reservoir connected to the liquid ice generator, and a first pump to circulate liquid ice between the liquid ice generator and the liquid ice reservoir, and the circulation subsystem comprises a second pump connected to the liquid ice reservoir to supply liquid ice to the means for impinging the liquid ice on the second side of the heat transfer plate opposite the side on which the electronic apparatus is disposed.

13. The cooling system according to claim 12 wherein the first and second pumps are variable frequency drive liquid pumps.

14. The cooling system according to claim 12, further comprising a stirring pump to recirculate liquid ice stored in the liquid ice reservoir.

15. The cooling system according to claim 12, further comprising a vacuum tank housing the means for impinging the liquid ice on the second side of the heat transfer plate and a vacuum pump connected to the vacuum tank for creating a vacuum in the vacuum tank, wherein the predetermined pressure is a partial vacuum, whereby the temperatures associated with phase changes of melting and boiling are lowered.

16. The cooling system according to claim 15, further comprising a heat exchanger connected to a bottom of the vacuum tank to cool liquid effluent from the vacuum tank and a condenser connected to the vacuum pump to condense steam evacuated from the vacuum tank.

17. The cooling system according to claim 12, further comprising a cooling water supply connected to the liquid ice generator.

18. The cooling system according to claim 16, further comprising one of a) a cooling water supply and b) a liquid ice supply connected to the heat exchanger and condenser.

* * * * *